United States Patent [19]
Hewitt

[11] Patent Number: 5,753,841
[45] Date of Patent: May 19, 1998

[54] PC AUDIO SYSTEM WITH WAVETABLE CACHE

[75] Inventor: Larry D. Hewitt, Austin, Tex.

[73] Assignee: Advanced Micro Devices, Inc., Sunnyvale, Calif.

[21] Appl. No.: 516,052

[22] Filed: Aug. 17, 1995

[51] Int. Cl.$^6$ .................................................. G10H 7/00
[52] U.S. Cl. .................................................. 84/604
[58] Field of Search ................................. 84/603–607

[56] References Cited

U.S. PATENT DOCUMENTS

| | | | |
|---|---|---|---|
| 3,515,792 | 6/1970 | Deutsch | 84/1.03 |
| 4,133,242 | 1/1979 | Nagai et al. | 84/1.13 |
| 4,201,105 | 5/1980 | Alles | 84/1.01 |
| 4,201,109 | 5/1980 | Kitagawa | 84/1.26 |
| 4,344,347 | 8/1982 | Faulkner | 84/1.26 |
| 4,471,681 | 9/1984 | Nishimoto | 84/1.23 |
| 4,472,993 | 9/1984 | Futamase et al. | 84/1.24 |
| 4,506,579 | 3/1985 | Rossum | 84/1.01 |
| 4,508,001 | 4/1985 | Suzuki | 84/1.01 |
| 4,524,668 | 6/1985 | Tomisawa et al. | 84/1.24 |
| 4,539,885 | 9/1985 | Ezawa | 84/1.25 |
| 4,569,268 | 2/1986 | Futamase et al. | 84/1.24 |
| 4,573,389 | 3/1986 | Suzuki | 84/1.26 |
| 4,622,877 | 11/1986 | Strong | 84/1.01 |
| 4,644,840 | 2/1987 | Franz et al. | 84/1.01 |
| 4,649,783 | 3/1987 | Strong et al. | 84/1.01 |
| 4,719,833 | 1/1988 | Katoh et al. | 84/1.01 |
| 4,731,851 | 3/1988 | Christopher | 381/104 |
| 4,843,938 | 7/1989 | Hideo | 84/1.19 |
| 4,916,996 | 4/1990 | Suzuki et al. | 84/603 |

(List continued on next page.)

FOREIGN PATENT DOCUMENTS

| | | |
|---|---|---|
| 0 463 411 A3 | 1/1992 | European Pat. Off. . |
| 0 474 177 A2 | 11/1992 | European Pat. Off. . |
| 0535839 | 4/1993 | European Pat. Off. . |
| WO 92/15087 | 3/1992 | WIPO . |

OTHER PUBLICATIONS

"SC18000/SC18005 Multimedia System Controller," Sierra Semiconductor, Rev. 0.92, pp. 1–23 (at least as early as Mar. 15, 1995).
"SC18024 ARIA™ Sound Processor," Sierra Semiconductor, Rev. 1.0, pp. 1–15 (at least as early as Mar. 15, 1995).
"SC18050 Aria Basic Sound ROM," Sierra Semiconductor, Rev. 0.91, pp. 1–3 (at least as early as Mar. 15, 1995).
"SC18051 1/2 Megabyte Sound ROM," Sierra Semiconductor, Rev. 1.0, pp. 1–3 (at least as early as Mar. 15, 1995).
"SC18052 1 Megabyte Sound ROM," Sierra Semiconductor, Rev. 1.0, pp. 1–3 (at least as early as Mar. 15, 1995).
U.S. Patent Application Ser. No. 72,838, entitled "Wave Table Synthesizer," by Travers, et al. (filed at least as early as Nov. 2, 1994).

(List continued on next page.)

*Primary Examiner*—Stanley J. Witkowski
*Attorney, Agent, or Firm*—Skjerven, Morrill, MacPherson, Franklin & Friel, L.L.P.; Michael P. Adams

[57] ABSTRACT

The PC audio circuit described interfaces with and provides audio enhancement to a host personal computer of the type including a central processor, system memory and a system bus. The PC audio circuit includes a digital signal processor (DSP) for processing wavetable data and generating digital audio signals for a plurality of voices. The wavetable data is stored in the host computer's system memory and transferred in portions, as needed by the DSP, to a smaller, low-cost cache memory included with the PC audio circuit. The DSP processes several frames of data samples for an active voice before processing another voice. Processing in this manner reduces the percentage use of system bus bandwidth and alleviates concerns about the maximum allowable system bus latency. Digital audio signals generated for each active voice are accumulated in cache memory. When the digital audio signals for all active voices have been accumulated, the accumulated data is transmitted from the cache memory to an external digital-to-analog converter. Since wavetable data is stored in system memory, the cache memory is smaller and less expensive than the local memory in prior art PC audio circuits. Thus, the described PC audio circuit has a lower overall cost.

36 Claims, 4 Drawing Sheets

U.S. PATENT DOCUMENTS

| | | | |
|---|---|---|---|
| 4,947,723 | 8/1990 | Kawashima et al. | 84/603 |
| 4,953,437 | 9/1990 | Starkey | 84/603 |
| 4,998,281 | 3/1991 | Sakata | 381/63 |
| 5,111,727 | 5/1992 | Rossum | 84/603 |
| 5,144,676 | 9/1992 | Rossum | 381/118 |
| 5,166,464 | 11/1992 | Sakata et al. | 84/662 |
| 5,187,314 | 2/1993 | Kunimoto et al. | 84/626 |
| 5,194,681 | 3/1993 | Kudo | 84/603 |
| 5,218,710 | 6/1993 | Yamaki et al. | 395/800 |
| 5,243,124 | 9/1993 | Kondratiuk et al. | 84/624 |
| 5,300,724 | 4/1994 | Medovich | 84/604 |
| 5,342,990 | 8/1994 | Rossum | 84/603 |
| 5,393,926 | 2/1995 | Johnson | 84/610 |
| 5,406,022 | 4/1995 | Kobayashi | 81/622 |
| 5,440,740 | 8/1995 | Chen et al. | 395/650 |

OTHER PUBLICATIONS

U.S. Patent Application Ser. No. 8/334,461, entitled "Digital Signal Processor for Wavetable Audio Synthesizer," by Norris, et al., filed Nov. 2, 1994.

OmniWave™ Multimedia Audio, by Samsung Semiconductor, Advance Information, KS0161, pp. 1–8 (Rev. A, Nov. 1994).

Preliminary specification, "Stereo continuous calibration DAC, TDA1545A," Phillips Semiconductors, pp. 4–212 to 4–229.

Preliminary Product Information, "Advanced Music Synthesizer, CS9203," Crystal Semiconductor Corp., DS117PP1, pp. 1–18 (Aug. 1993).

Preliminary Product Information, "Programmable Music Processor, CS8905," Crystal Semiconductor Corp., DS116PP1, pp. 1–19 (Aug. 1993).

Preliminary Product Information, "CDBGMR4 Music Synthesis Eval. Board," Crystal Semiconductor Corp., DS127PP1, pp. 1–24 and schematics (Aug. 1993).

Application Note, "A Tutorial on MIDI and Music Synthesis, Music Synthesis," by Jim Heckroth, Crystal Semiconductor Corp., AN27REV1, pp. 1–6 (Aug. 1993).

"OPL3, YMF262, FM Operator Type L3," Yamaha LSI, YMF262 Application Manual, Catalog No. LSI–6MF2622, pp. 1–31 (1992.4).

"YMZ263, Multimedia Audio & Game Interface Controller (MMA)," Yamaha LSI, Jul. 1, 1992, pp. 1–33.

"YMF262, FM Operator Type L3 (OPL3)," Yamaha LSI, Catalog No. LSI–4MF2622, pp. 1–19 (1991.10).

Preliminary, "YMF278–F (OPL4), 4 Operator FM and WAVE Synthesis Chip," Yamaha LSI, Yamaha Corp., Catalog No. LS1278F, Version 1.01 (Feb. 1, 1993), pp. 1–31.

"Musical Applications of Microprocessors," by Hal Chamberlin, Hayden Book Company, Second Edition (1985), Chapters 1, 2, 4, 13, 14, 17 and 19–21.

John Snell, "Design of a Digital Oscillator Which Will Generate Up to 256 Low Distortion Sine Waves in Real Time," Apr. 1977, pp. 4–25.

PC AUDIO SYSTEM WITH WAVETABLE CACHE

BACKGROUND OF THE INVENTION

1. Field of the Invention

This invention relates to a PC audio system wherein wavetable data for a wavetable audio synthesizer is supplied by PC system memory. More particularly, this invention relates to a PC audio system, including a wavetable audio synthesizer and wavetable cache, which interfaces with PC system memory to access wavetable data.

2. Brief Description of the Related Technology

Several types of digital "synthesizers," i.e. devices that generate sound through audio digital-signal-processing, are now available. One modern type of digital synthesizer is a wavetable synthesizer. Wavetable synthesizers generate sounds through digital processing of entire digitized sound waveforms or portions of digitized sound waveforms stored in wavetable memory. See U.S. Pat. No. 5,659,466, entitled "Monolithic PC Audio Circuit with Enhanced Digital Wavetable Audio Synthesizer," by Norris, et al., which is incorporated herein by reference.

Wavetable synthesizers generate sounds by "playing back" from wavetable memory, to a digital-to-analog converter (DAC), a particular digitized waveform. The addressing rate of the wavetable data controls the frequency or pitch of the analog output. The bit width of the wavetable data affects the resolution of the sound being generated. For example, better resolution can be achieved with 16-bit wide data versus 8-bit wide data. 16-bit digital audio is becoming the standard in the industry.

Wavetable synthesizers have application in personal computers. Typically, personal computers are manufactured with only limited audio capabilities. These limited capabilities provide monophonic tone generation to provide audible signals to the user concerning various simple functions, such as alarms or other user alert signals. The typical personal computer system has no capability of providing stereo, high-quality audio which is a desired enhancement for multimedia and video game applications, nor do they have built-in capability to generate or synthesize music or other complex sounds. Musical synthesis capability is necessary when the user desires to use a musical composition application to produce or record sounds through the computer to be played on an external instrument, or through analog speakers and in multimedia (CD-ROM) applications as well.

Additionally, users at times desire the capability of using external analog sound sources, such as stereo equipment, microphones, and non-MIDI electrical instruments, to be recorded digitally and/or mixed with digital sources before recording or playback through their computer. To satisfy these demands, a number of add-on products have been developed. One such line of products is referred to in the industry as a sound card. These sound cards are circuit boards carrying a number of integrated circuits, many times including a wavetable synthesizer, wavetable memory and other associated circuitry which the user installs in expansion slots provided by the computer manufacturer. The expansion slots provide an interface to the system bus thereby enabling the host processor to access sound generation and control functions on the board under the control of application software. Typical sound cards also provide MIDI interfaces and game ports to accept inputs from MIDI instruments such as keyboard and joysticks for games.

One prior art sound card is that offered by Advanced Gravis and Forte under the name Ultrasound. This sound card is an expansion slot embodiment which incorporates into one chip (the "GF-1") a wavetable synthesizer, MIDI and game interfaces, DMA control and Adlib Sound Blaster compatibility logic. In addition to this ASIC, the Ultrasound card includes on-board DRAM (1 megabyte) for wavetable data; an address decoding chip; separate analog circuitry for interfacing with analog inputs and outputs; a separate programmable ISA bus interface chip; an interrupt PAL chip; and a separate digital-to-analog/analog-to-digital converter chip. See U.S. patent application Ser. No. 072,838, entitled "Wave Table Synthesizer," by Travers, et al., which is incorporated herein by reference.

On-board sound card memory typically has a size of between one-half to four megabytes and stores all the wavetable data used to synthesize music. At a cost of about $25.00 per megabyte, sound card memory cost is a significant factor in the overall cost of the sound card. Therefore, if PC system memory could be used to supply the wavetable data, thereby eliminating or reducing the need for sound card memory, sound cards would be less expensive.

Utilizing PC system memory to store wavetable data, however, raises some concerns. One concern is that available PC system memory is limited and cannot be spared for wavetable data. However, this should be less of a concern in future state-of-the-art PCs which are expected to contain larger system memories and should have space available for wavetable data. Another concern with using system memory is the numerous accesses to memory that are required by prior art synthesizers. For example, prior art wavetable synthesizers which can synthesize thirty-two independent voices (i.e., instrument sounds) must access memory thirty-two times every 22.7 microseconds to retrieve the required data samples. If this number of accesses was made to system memory, an unacceptably high percentage of the system bus bandwidth would be used for synthesizer operations, and thus less of the bus bandwidth could be used for other PC operations.

A further concern is that the synthesizer might process wavetable data faster than it receives it from system memory (i.e., faster than the system's maximum bus latency). Such a situation would be unacceptable since the processed data would have gaps, and undesirable pops would occur in the synthesized music as it is played.

Therefore, there is a need for a PC audio system which synthesizes music from wavetable data supplied by system memory, but does not utilize an unacceptable percentage of bus bandwidth. Furthermore, there is a need for a PC audio system which obtains data from system memory at a rate which is at least as fast as the rate it processes data (i.e., the maximum bus latency is less than or equal to the PC audio system's rate of processing data).

SUMMARY OF THE INVENTION

The PC audio circuit of the present invention is designed to interface with and provide audio enhancement to a host personal computer of the type including a central processor, system memory and system bus. The PC audio circuit includes a cache memory that is of a significantly reduced size and cost and can only store portions of the total wavetable data at a time. Instead, all the wavetable data is stored in system memory of the host PC and transferred in portions to the cache memory, as needed by the PC audio circuit. The PC audio circuit processes the data and generates digital audio signals, such as music or sound effects. Because the cache memory is of reduced size and cost, the PC audio circuit has a lower overall cost than prior art systems.

Unlike prior art PC audio systems, the PC audio circuit of the present invention processes several frames of data samples for a voice before processing the next designated voice. Thus, several wavetable data samples for a given voice can be retrieved from system memory at one time and made available in the cache memory, thereby reducing the total number of accesses to memory required and the percentage use of system bus bandwidth. Processing the data samples in this manner also allows for certain parallel processing operations. For example, while a plurality of data samples are being processed for active voices, other groups of data samples can be retrieved from system memory and made available for processing in the cache memory. This ensures a continuous supply of data and reduces concerns about the maximum allowable system bus access latency.

Since the PC audio circuit of the present invention retrieves several wavetable data samples at once, it is preferable that a voice's data samples be organized together in a block in system memory. Thus, if a consecutive series of data samples are requested, they can be accessed using the system memory's page mode which will increment through the data samples in the block. Preferably, the bus between system memory and the PC audio circuit is a PCI bus, thereby enabling data accessed through the page mode to be transmitted to the PC audio circuit in burst mode.

In the preferred embodiment, the PC audio circuit of the present invention includes a PCI bus interface block, an internal address data bus, digital signal processor, output control state machine, internal bus arbiter, and cache memory. The PC audio circuit can be formed on a monolithic integrated circuit, which includes the cache memory or with the cache memory external to the integrated circuit. Data in the system memory is transmitted over the PCI bus, through the PCI interface block, over the internal bus, and into the cache memory.

The digital signal processor (DSP) performs computations and other processing to translate the data samples in the cache memory into digital audio signals suitable for conversion into desired analog audio signals. Preferably, the DSP can generate up to 32 independent digital audio signals or voices at a 44.1 KHz frame rate.

The digital audio signals generated for each voice by the DSP are accumulated in the cache memory, or can be accumulated in a separate cache memory, until they are ready to be output to an external digital-to-analog converter (DAC). The output control state machine (OCSM) controls the transmission of the accumulated data from the cache out to the external DAC at a sample rate of 44.1 KHz. The internal bus arbiter (IBA) is responsible for directing traffic between the various blocks that will access the internal bus, including the OCSM, the cache, the PCI interface block, and the DSP. The internal bus operates at 33 MHz, along with most of the logic, from a clock that is provided as part of the PCI standard.

The cache preferably is a low-cost SRAM having a capacity of about 8 to 32 kilobytes. The available memory in the cache can be assigned to data sample storage, accumulator storage, and general storage for the DSP. Data samples can be stored in data queues A and B, while the digital audio signals generated by the DSP can be stored in accumulator queues A and B. In a suitable embodiment, data queues A and B each store up to 64 16-bit data samples for each of 32 voices, while accumulator queues A and B each accumulate the generated data samples for up to 32 voices. The generated data samples are accumulated together in accumulator queue A or B as one set of 64 16-bit data samples.

The PCI interface block detects when there is a need to update the cache with data samples and initiates bus master requests. The addresses in system memory from which the data samples are to be retrieved are sent from the PCI interface block to the PCI address bus. Under the control of the PCI interface block, data samples retrieved from system memory are transmitted on the internal data bus to the cache.

At start-up of the preferred embodiment of the PC audio circuit, 128 data samples are loaded into the cache (64 data samples in each of data queues A and B) for each active voice. Once data queues A and B are loaded with data, the DSP processes the data samples in one of the data queues, for the first active voice. The other data queue is presently inactive. Then, the DSP processes the data samples for the next designated active voice. As the DSP processes these data samples, the data samples just generated by the DSP are accumulated in one of the accumulator queues. This process continues until all active voices have been processed, and then the accumulator queues toggle and the other accumulator queue will accumulate generated data samples while the accumulated data samples in the first accumulator queue can be output to an external DAC.

Once the data samples for each active voice in the data queue are processed, the PCI interface block sends requests on the PCI bus for additional data samples from system memory. The data samples retrieved from system memory are stored in the first data queue, thereby writing over the data samples just processed. While these data samples are being retrieved, the DSP processes the data samples in the other queue. Then, the data queues toggle, and the process continues, allowing up to 64 data samples to be processed at a time.

If the DSP processes the data samples at the same frequency as the sampling frequency used during analog-to-digital conversion (recording) of the original audio signal, then when the audio signals generated by the DSP are converted to analog and played, the resulting audio signal will sound the same (i.e., have the same frequency) as the original audio signal used to create the data samples. When the frequency of the audio signal being played is the same as the recording frequency, its frequency ratio ($F_c$) equals 1. If $F_c>1$, then generated audio signals will have a higher pitch then the signal recorded. If $F_c=1$ for each of the active voices, then the maximum allowable PCI bus latency equals the time it takes to process 64 frames of data samples at the 44.1 KHz frame rate. However, if $F_c>1$ for one or more active voices, the maximum allowable PCI bus latency is reduced because the DSP processes more than one data sample per frame per voice. For $F_c=2$, the reduction in the maximum allowable bus latency may become a problem.

The latency problem for $F_c>2$ can be avoided by having the PC audio circuit retrieve only the data samples which will be processed and not the data samples which will be skipped by the DSP. Thus, all the data samples retrieved and stored in a data queue will be processed. This feature is implemented by providing means in PCI interface block for accessing the $F_c$ values for the active voices, and then calculating the next system memory address for retrieving data samples for a given voice based on the current system memory address and the $F_c$ value. Retrieving only select samples for each active voice when $F_c>1$ reduces the available PCI bandwidth since the burst mode cannot be used for transmitting the data samples. However, the PC audio circuit's percentage usage of the bandwidth is expected to be acceptable regardless of whether the burst mode is used.

BRIEF DESCRIPTION OF THE DRAWINGS

A better understanding of the present invention can be obtained when the following detailed description of the preferred and alternative embodiments is considered in conjunction with the following drawings, in which.

DETAILED DESCRIPTION

I. PC AUDIO CIRCUIT OVERVIEW

Figure 1:
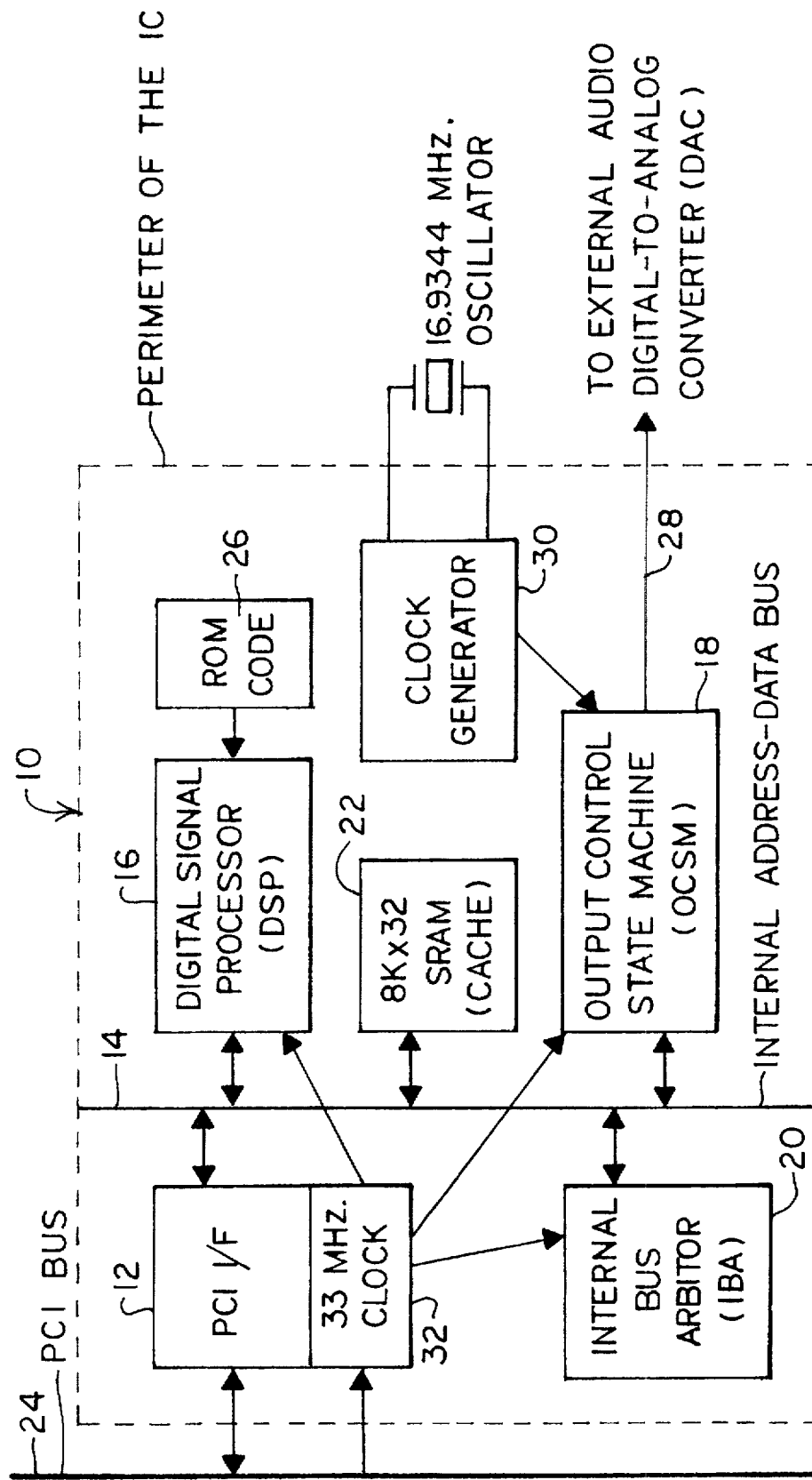
FIG. 1 is a block diagram of the PC audio circuit of the present invention as interfaced with the system bus of a host computer.

The following description sets forth the preferred and alternative embodiments of a PC audio circuit which can be formed on a monolithic integrated circuit. The PC audio circuit is designed to interface with and provide audio enhancement to a host personal computer of the type including a central processor, system memory and system bus. The fundamental difference between the PC audio circuit of the present invention and prior art PC audio circuits is that the local memory is of a significantly reduced size (e.g., 8–32 kilobytes) and can only store portions of the total wavetable data at a time. Instead, all the wavetable data (e.g., 1–4 megabytes) is stored in system memory of the host PC and transferred in portions to the PC audio circuit's local memory, also known as a cache memory, as needed by the PC audio circuit. The PC audio circuit uses the data to generate digital audio signals such as music or sound effects.

As discussed in the Background of the Invention, if system memory is utilized to store wavetable data, thereby reducing the size of the local memory, the overall cost of the PC audio circuit will be reduced. However, the use of system memory raises concerns that: (i) an unacceptable percentage of system bus bandwidth will be used; and (ii) the PC audio circuit will process wavetable data faster than the host computer's maximum bus latency. The PC audio circuit of the present invention is designed to alleviate these concerns.

The typical frame rate for audio is 44.1 KHz. At this frame rate, each frame is approximately 22.7 microseconds. Thus, if a prior art PC audio circuit generates 32 voices during a frame, 32 data accesses must be made to memory during this short time period. This is not a problem if the data accesses are to local memory. If the number of accesses is made to system memory, however, bus bandwidth usage and bus latency would become a concern.

Unlike prior art systems, the PC audio circuit of the present invention processes several frames of data samples for a voice before processing the next designated voice. Thus, several wavetable data samples for a given voice can be retrieved from system memory at one time and made available in the cache memory, thereby reducing the total number of accesses to memory required and the percentage use of bus bandwidth. Processing the data samples in this manner also allows for certain parallel processing operations. For example, while a plurality of data samples are being processed for active voices, other groups of data samples can be retrieved from system memory and made available for processing in the PC audio circuit's cache memory. This ensures a continuous supply of data and reduces concerns about the bus access latency.

Since the PC audio circuit of the present invention retrieves several wavetable data samples at once, it is preferable that a voice's data samples be organized together in a block in the system memory. Thus, if a consecutive series of data samples are requested, they can be accessed using the system memory's page mode which will increment through the data samples in the block. If the bus between system memory and the PC audio circuit is a PCI bus (i.e., a higher performance bus), data accessed through the page mode can be transmitted to the PC audio circuit in burst mode (i.e., at a faster rate). Use of the burst mode decreases the maximum bus latency and the percentage of bandwidth usage.

II. PC AUDIO CIRCUIT ARCHITECTURE

FIG. 1 illustrates the preferred architecture of the PC audio circuit. As illustrated, the PC audio circuit 10 includes a PCI bus interface block 12, internal address data bus 14, digital signal processor 16, output control state machine 18, internal bus arbiter 20, and cache memory 22. Data is passed from the PCI bus 24, through PCI interface block 12, over the internal bus 14, and into the cache 22. The PC audio circuit 10, including cache 22, can be formed on a monolithic integrated circuit. The dashed box in FIG. 1 represents the perimeter of a preferred embodiment of such an integrated circuit. Alternatively, the cache 22 may be external to the circuit.

The digital signal processor (DSP) 16 operates on the data similarly to the wavetable synthesizer DSP disclosed in U.S. Pat. No. 5,659,466, entitled "Monolithic PC Audio Circuit with Enhanced Digital Wavetable Audio Synthesizer," by Norris, et al., which is incorporated herein by reference. In other words, the DSP 16 of the present invention performs computations and other processing to translate raw wavetable data into digital audio signals suitable for conversion into the desired analog audio signals. The DSP 16 operates from instructions stored in ROM code 26 and preferably can generate up to 32 independent digital audio signals or voices at a 44.1 KHz frame rate. Unlike the wavetable synthesizer disclosed in the above-referenced patent application, however, the DSP 16 of the present invention processes several frames of wavetable data samples from voice to voice, rather than one data sample per voice per frame. The implementation details for DSP 16 are within the level of skill possessed by those of ordinary skill in the art.

The digital audio signals generated for each voice by DSP 16 are accumulated in cache 22, or can be accumulated in a separate cache memory, until they are ready to be output on port 28 to an external audio digital-to-analog converter (DAC). The output control state machine (OCSM) 18 is responsible for transmitting the accumulated data from the cache 22 out to the external DAC at the sample rate of 44.1 KHz. OCSM 18 utilizes its own 16.9344 MHz clock 30 to ensure synchronization with to the sample rate. The internal bus arbiter (IBA) 20 is responsible for directing traffic between the various blocks that will access the internal bus 14, including the OCSM 18, the cache 22, the PCI interface block (PCI I/F block) 12 and the DSP 16. The internal bus 14 operates at 33 MHz, along with most of the logic, from a clock 32 that is provided as part of the PCI standard.

Internal Bus. The internal bus 14 has a 32-bit data bus and a 16-bit address bus. The address map for the internal bus is as follows:

| Address Range (hexadecimal) | Data |
| --- | --- |
| 0000 through 1FFF | 8K × 32 SRAM cache. This space provides the port into the cache memory. |
| 2000 through 201F | 32 PCI I/F-block voice cache status registers. There are 32 of these registers, one to correspond to each of the 32 possible voices. Bit[0] of these registers is set (by the DSP) when that voice needs cache queue A updated with data from the PCI bus. (See discussion below regarding cache.) Bit[1] of these registers is set (by the DSP) when that voice needs cache queue B updated with data from the PCI bus. After the PCI interface block has successfully updated the data in the cache queue for a voice, then it clears the bit. Bit[2] is high to indicate that the voice is active and low to indicate that the voice is not active. When bit[2] goes 10 low, the current system address register is reset to become the same as the system address start register (see discussion below). |
| 2020 through 203F | 32 PCI I/F-block system address start registers. These are 32-bit pointers to each of the 32 voices' system memory start addresses for the sample. When processing of a voice starts, data is initially brought in starting from this location in system memory. |
| 2040 through 205F | 32 PCI I/F-block system address end registers. These are 32-bit pointers to each of the 32 voices' system memory end addresses for the sample. |
| 2060 through 207F | 32 PCI I/F-block system address loop point registers. These are 32-bit pointers to each of the 32 voices' system memory loop point addresses for the sample. As data for a voice is brought into the PC audio circuit from the PCI bus, if the address crosses over the end address, then it jumps back to the address specified by these registers. |
| 2080 through 209F | 32 PCI I/F-block current system address registers. These registers store the current address in system memory from which the sample data for each of the 32 voices is accessed. They increment whenever a new 32-bit word is brought in from system memory to the cache. They jump from the system address end register location to the system address loop point location when the current address passes the end point. |
| 3000 | OCSM sample count register. This is a 7 bit counter that increments from its starting point, zero, whenever accumulated data is output from the cache and sent to the external DAC. The DSP can observe bit 7 of this counter to determine when it is time to start accumulating the next group of 64 samples. |
| 3001 | OCSM control register. When bit[0] of this register is cleared (by the DSP) then no data is passed out to the DAC. When it is high, then data is drawn from the accumulator cache and passed to the external DAC. |

PCI Bus. The PCI bus is assigned a block of 256 I/O (byte wide) addresses through standard PCI plug and play circuitry. These addresses are used by the system's central processor as follows:

| I/O Address Range (hexadecimal) | Data |
| --- | --- |
| 80 through 81 | Internal bus address register. The System CPU is allowed access to the internal bus by setting up the 16-bit address in these two ports and writing or reading through the data ports below. |
| 84 through 87 | Internal data bus port. Access (read and write) to the internal bus is allowed via this port with the internal address specified by 80-81 above. |

Figure 2:
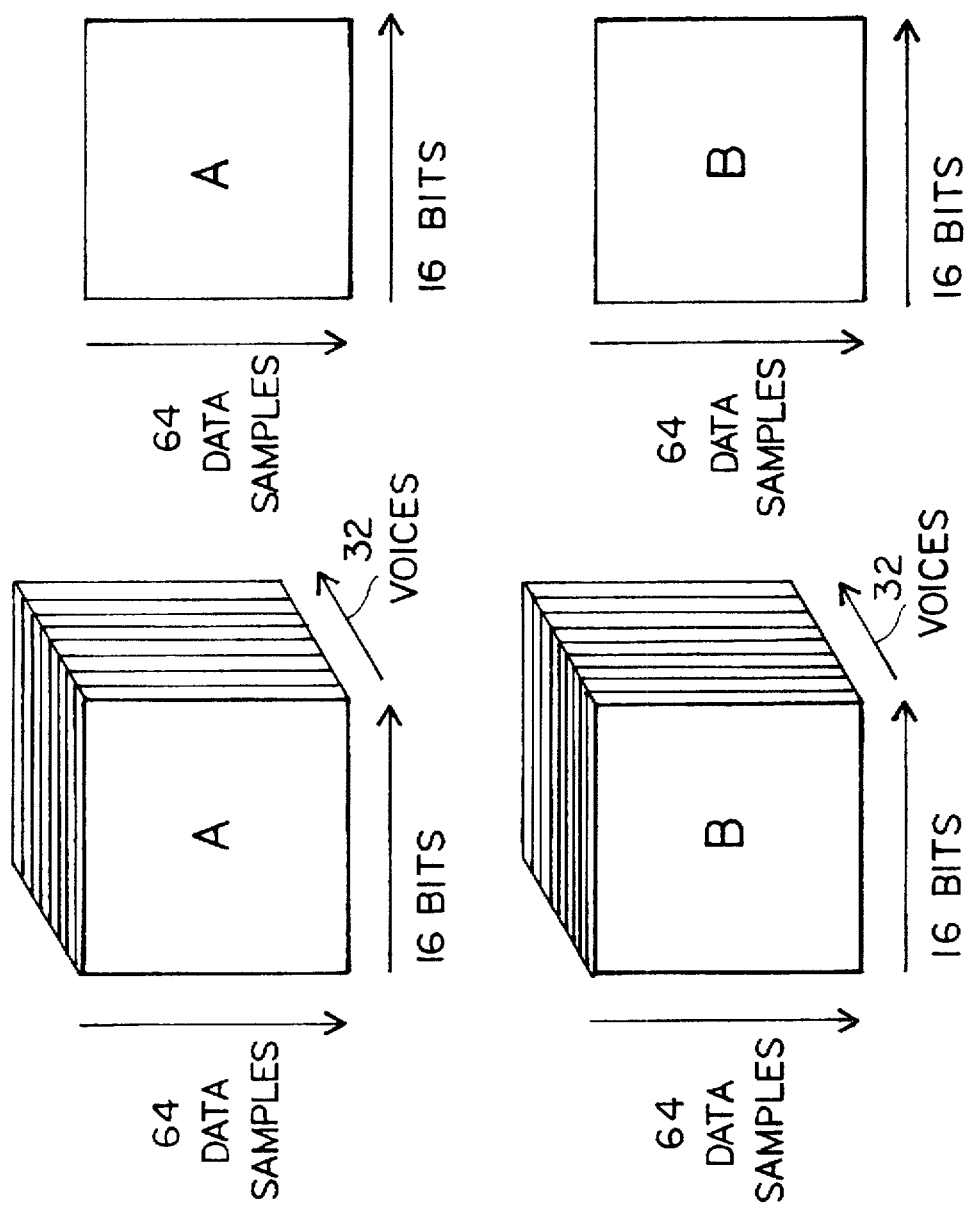
FIG. 2 depicts how memory can be assigned in the cache memory of the present invention.

Wavetable Cache RAM. Cache 22 preferably is a low-cost SRAM having a capacity of about 8 to 32 kilobytes. The available memory in cache 22 can be assigned to data sample storage, accumulator storage, and general storage for DSP 16. FIG. 2 depicts how the available memory can be suitably assigned between data sample storage and accumulator storage. Data samples can be stored in data queues "A" and "B", while the digital audio signals generated by DSP 16 (generated data samples) can be stored in accumulator queues "A" and "B." See FIG. 2. Data queues A and B can each store up to 64 16-bit data samples for each of 32 voices.

Accumulator queues A and B each can accumulate the generated data samples for up to 32 voices. The generated data samples are accumulated together in queue A or B as one set of 16-bit data samples. There can be up to 64 data samples in a set.

Data queues A and B together can store up to 8 kilobytes, while accumulator queues A and B together can store up to 256 bytes. Additional memory can be provided in cache 22 for general DSP storage.

Preferably, one of the two data queues for a voice is used to store data samples as they are retrieved from system memory while the other data queue supplies data samples to the DSP 16. Thus, if data queue A supplies data samples to DSP 16, then data queue B stores data samples retrieved from system memory. Data queue B is filled with the next set of data samples to be processed by DSP 16, and must be filled before the DSP completes the processing of the data samples in data queue A. Otherwise, there will be undesirable gaps in the generated digital audio signals. When all the data samples in data queue A have been processed, data queues A and B are toggled, and DSP 16 processes the data samples stored in data queue B, and data samples retrieved from system memory are stored in data queue A. This process continues as long as DSP 16 processes data samples.

Similarly, one of the accumulator queues is used to supply accumulated data samples to an external DAC, while the other accumulator accumulates data samples generated by DSP 16. Thus, if accumulator queue A supplies accumulated data samples, then accumulator queue B accumulates data samples. The generated data samples for all of the active voices must be accumulated in accumulator queue B before all the data samples in accumulator queue A have been transmitted to the external DAC. Otherwise, there will be gaps in the analog signal. When all the data samples in accumulator queue A have been transmitted to the external DAC, accumulator queues A and B toggle, and data samples accumulated in data queue B are transmitted to the external DAC, and generated data samples are accumulated in data queue A. The overall operation of the present invention is further discussed below.

An address map for a wavetable cache suitable for the present invention is as follows:

| Address Range (hexadecimal) | Data |
| --- | --- |
| 0000 through 001F | Cache queue "A" for voice 0 of 31 |
| 0020 through 003F | Cache queue "B" for voice 0 of 31 |
| 0040 through 005F | Cache queue "A" for voice 1 of 31 |
| 0060 through 007F | Cache queue "B" for voice 1 of 31 |
| 0080 through 07BF | Caches for voices 2 through 30 |
| 07C0 through 07DF | Cache queue "A" for voice 31 of 31 |
| 07E0 through 07FF | Cache queue "B" for voice 31 of 31 |
| 0800 through 083F | Accumulator cache "A" |
| 0840 through 087F | Accumulator cache "B" |
| 0880 through 1FFF | General Storage for the DSP |

Figure 3:
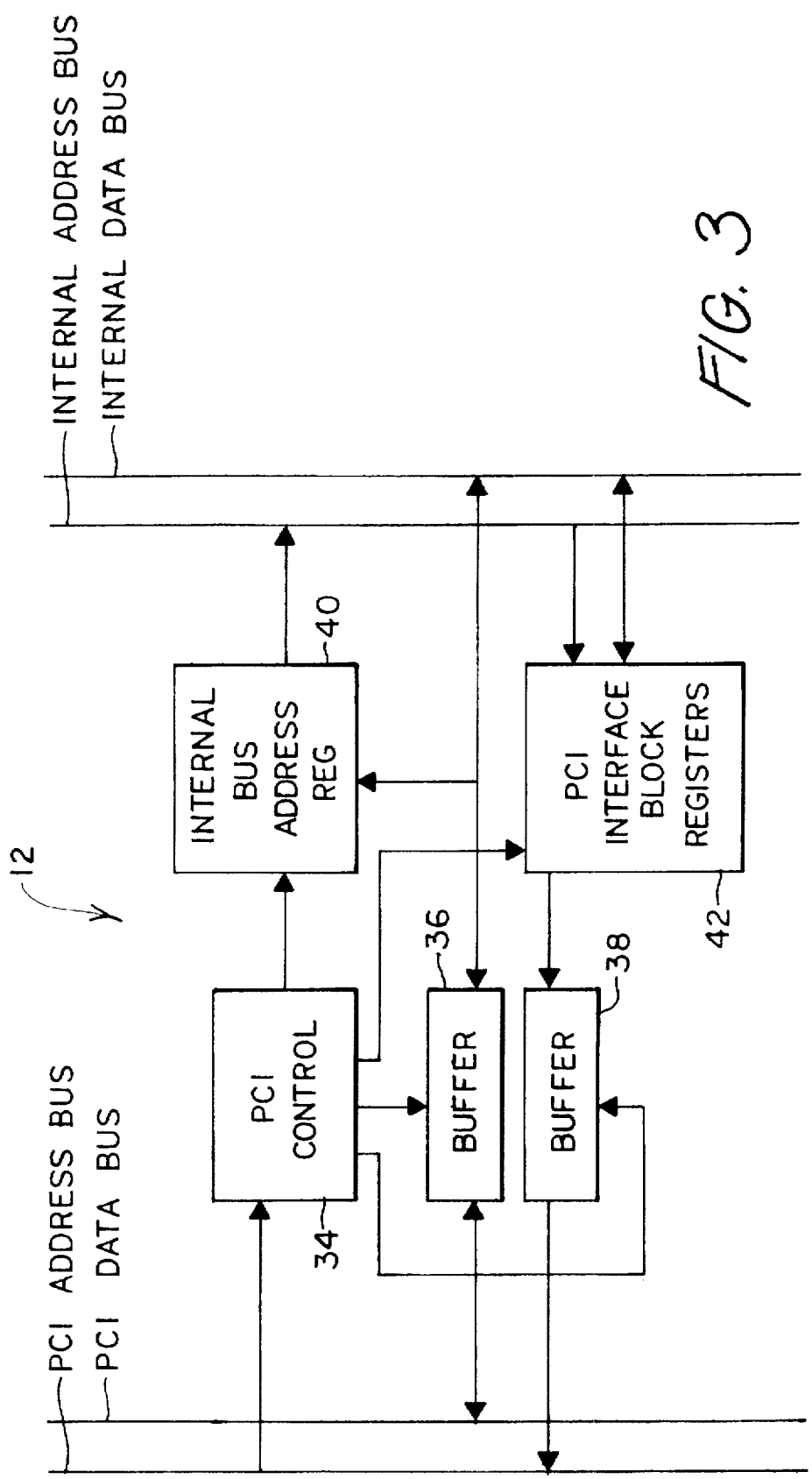
FIG. 3 is a block diagram of the PCI bus interface block of the present invention as interfaced with system and internal buses.

The PCI Interface. FIG. 3 sets forth a block diagram of PCI interface block 12. PCI interface block 12 includes PCI interface controller 34, buffers 36 and 38, internal bus address register 40, and PCI I/F block registers 42. As illustrated, PCI controller 34 is connected to the PCI address bus, buffers 36 and 38, internal bus address register 40, and PCI I/F block registers 42. Buffer 36 connects to the PCI data bus, PCI controller 34, internal bus address register 40, and the internal data bus, while buffer 38 connects to the PCI address bus, PCI controller 34, and PCI I/F block registers 42. Internal bus address register 40 connect to PCI controller 34, the internal address bus, the internal data bus, and buffer 36. Finally, PCI I/F block registers 42 are connected to buffer 38, PCI controller 34, and the internal data and address buses.

PCI I/F block registers 42 contain status and address information which indicates which voice requires additional data samples to be stored in cache and the address in system memory to obtain the data samples. A detailed description of these registers is set forth in the above address map for the internal bus. Internal bus address register 40 is used by the system central processor to access the PC audio circuit registers on the internal bus. For example, the central processor may need access to the PCI I/F block registers in order to write system memory addresses which indicate wavetable data storage locations. Internal bus address register 40 also stores the addresses of cache 22 at which wavetable data samples from system memory are stored. As set forth in the I/O address table above, the central processor accesses a register on the internal bus by writing its address, via buffer 36, in the internal bus address register 40. Read or write accesses to a particular register is provided through the port specified in the above table.

Based on the status information stored in PCI I/F block registers 42, PCI interface controller 34 detects when there is a need to update cache 22 with data samples and initiates bus master requests. Under the control of PCI interface controller 34, the addresses in system memory from which data samples are to be retrieved are sent from the PCI interface block registers 42, through buffer 38, to the PCI address bus. Retrieved data samples from system memory are sent on the PCI data bus to buffer 36. Under the control of PCI interface controller 34, data samples in buffer 36 are transmitted on the internal data bus to cache 22. The addresses in cache 22 for storing the data samples are contained in internal bus address register 40 and transmitted on the internal address bus. Preferably, PCI interface block 12 can request data samples for more than one active voice at a time.

PCI controller 34 calculates the cache addresses for storing the data samples by determining which voice is being updated, whether queue A or B is being updated, and which 32-bit word of the queue is being updated. PCI controller 34 contains thirty-two 5-bit counters-one for each voice-to determine which sample in the queue is the next to be updated by the PCI interface block 12. PCI interface block registers 42 include thirty-two 1-bit toggle registers—one for each voice—to indicate which queue each voice is currently using. These registers toggle each time a queue is filled by the PCI interface block 12. The PCI controller 34 stores the calculated cache addresses in the internal bus address register 40 and controls when they are output onto the internal address bus. The implementation details of PCI interface block 12 are within the level of skill possessed by those of ordinary skill in the art.

Figure 4:
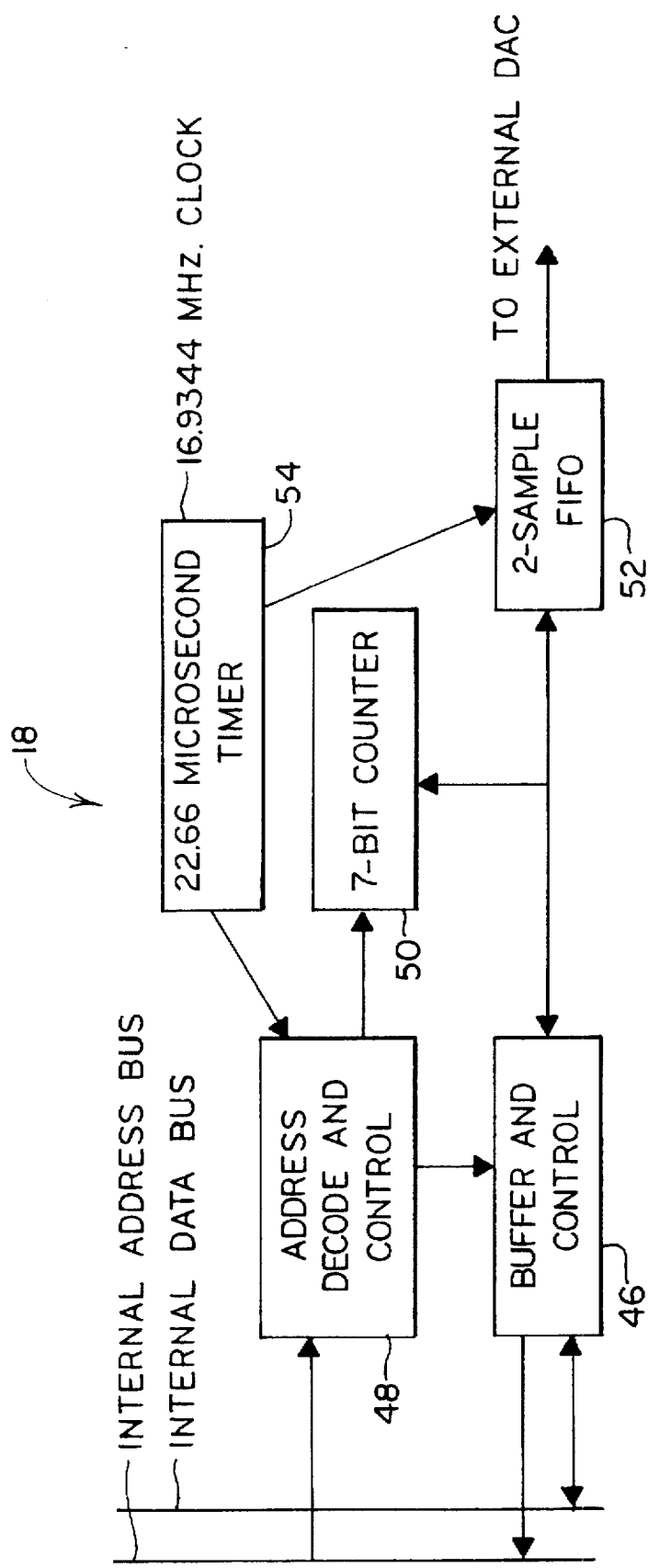
FIG. 4 is a block diagram of an output control state machine of the present invention as interfaced with internal buses.

The Output Control State Machine. FIG. 4 sets forth a block diagram of OCSM 18. As illustrated, OCSM 18 includes a control block 46, with buffer, address decode and control block 48, 7-bit counter 50, and 22.66 microsecond timer 54. As illustrated, control block 46 is connected to the internal address and data buses, the address decode and control block 48, the 7-bit counter 50, and FIFO 52. Address decode and control block 48 is connected to the internal address bus, control block 46, 7-bit counter 50, and timer 54. Seven-bit counter 50 is connected to address decode and control block 48, control block 46, and FIFO 52. The seven-bit counter is described in the above address map for the internal bus, and is referred to as the OCSM sample count register. FIFO 52 can store two data samples, one in a top location and the other in a bottom location, and is connected to control block 46, 7-bit counter 50, timer 54, and an external DAC. Timer 54 connects to address decode and control block 48, FIFO 52, and clock generator 30.

The DSP 16 enables OCSM 18 by writing to its control register. Once OCSM 18 is enabled, two data samples are transmitted, under the control of control block 46, on the internal data bus from an accumulator queue in cache 22, through the buffer in the control block 46, into FIFO 52. Every 22.66 microseconds, as indicated by timer 54, the FIFO 52 shifts the data sample in the bottom location to the top location, thereby enabling it to be output to the external DAC. The data sample previously in the top location is discarded. At the same time, another data sample is retrieved from cache 22 and stored in the bottom location of FIFO 52, and, under the control of address decode and control block 48, the 7-bit counter 50 is incremented. Address decode and control block 48 calculates the addresses of data samples to be retrieved from cache 22 from the 7-bit counter 50 and cache address information supplied on the internal address bus. These calculated addresses are sent to control block 46 where they are used to request specific data samples from cache 22. The implementation details of OCSM 18 are within the level of skill possessed by those of ordinary skill in the art. DSP 16 can observe bit 7 of counter 50 to determine when it is time to start accumulating the next group of data samples.

The Internal Bus Arbiter. Internal bus arbiter 20 is a simple arbiter that has a fixed priority for bus requests from: (i) the DSP 16 (lowest priority); (ii) the PCI bus interface block 12 (middle priority); and (iii) the OCSM 18 (highest priority). Arbiter 20 grants bus access to the requesting device having highest priority, at which point that device is free to drive the address bus and either the READ or WRITE signal. If the access is a read, then the priority device will capture or use the data from the data bus; if the access is a write, then the priority device will drive the data bus. The implementation details of arbiter 20 are within the level of skill possessed by those of ordinary skill in the art.

III. PC AUDIO SYSTEM OPERATION

At start-up of the preferred embodiment of PC audio circuit 10, 128 data samples are loaded into the cache 22 (64 data samples in each of data queues A and B) for each active voice. Assuming 32 active voices, this makes the worst case for required memory:

(32 voices) (128 samples/voice) (2 bytes/sample)=8 kilobytes

Additionally, cache 22 requires accumulator queues A and B having capacity of 64 data samples each. Thus, the additional required memory is:

(2 queues) (64 samples/queue) (2 bytes/sample)=256 bytes

As discussed above, additional memory may be provided for general DSP operations.

Once data queues A and B are loaded with data, the DSP 16 processes the data samples in one of the data queues, for the first active voice (e.g., voice 0). The other data queue is presently inactive. Then, DSP 16 processes the data samples for the next designated active voice (e.g., voice 1). As DSP 16 processes these data samples, the data samples just generated by DSP 16 are accumulated in one of the accumulator queues. This process continues until all active voices have been processed, and then the accumulator queues toggle and the other accumulator queue will accumulate generated data samples while the accumulated data samples in the first accumulator queue can be output to the external DAC.

Also, once the data samples for each active voice in the first data queue are processed, the PCI interface block 12 sends requests on the PCI bus for additional data samples from system memory. The data samples retrieved from system memory are stored in the first data queue, thereby writing over the data samples just processed. While these additional data samples are being retrieved, the DSP 16 processes the data samples in the other queue. Then, the data queues toggle, and the process continues, allowing up to 64 data samples to be processed at a time.

If DSP 16 processes the data samples at the same frequency as the sampling frequency used during analog-to-digital conversion (recording) of the original audio signal, then when the audio signals generated by the DSP are converted to analog and played, the resulting audio signal will sound the same (i.e., have the same frequency) as the original audio signal used to create the data samples. When the frequency of the audio signal being played is the same as the recording frequency, its frequency ratio ($F_c$) equals 1. For example, if a middle C note (middle C=440 Hz) of a piano is recorded and $F_c$=1, then the audio signal generated or played will be at the same frequency and sound the same as the signal recorded. If $F_c$>1, the generated audio signal will have a higher pitch. For $F_c$=4, the generated audio signal is two octaves higher than the sampling frequency of the signal recorded.

If $F_c$=1 for each of the active voices, then the maximum allowable PCI bus latency equals the time it takes to process 64 frames of data samples at the 44.1 KHz frame rate.

64 frames×1/44100 seconds=1.45 milliseconds

However, if $F_c$>1 for one or more active voices, the maximum allowable PCI bus latency is reduced because DSP 16 processes more than one data sample per frame per voice. In other words, the data samples in a data queue for a particular voice are consumed faster than if $F_c$=1. For example, for $F_c$=2, DSP 16 skips every other data sample in the data queue. For $F_c$>2, the reduction in the maximum allowable bus latency may become a problem.

The latency problem for $F_c$>2 can be avoided by having the PC audio circuit 10 retrieve only the data samples which will be processed and not the data samples which will be skipped by DSP 16. Thus, all the data samples retrieved and stored in a data queue of cache 22 will be processed. This feature is implemented by providing means in PCI interface block 12 for accessing the $F_c$ values for the active voices, and then calculating the next system memory address for retrieving data for a given voice based on the current system memory address and the $F_c$ value. For example, if $F_c$=4 for a given active voice, then: next system memory address= current address+4. The implementation details for this feature are within the level of skill possessed by those of ordinary skill in the art.

Retrieving select data samples for each active voice when $F_c$>1 reduces the available PCI bandwidth since the burst mode cannot be used for transmitting the data samples. However, this is not expected to cause any problems.

When the PCI bus is in burst mode, it typically operates at 60 ns/32 bits and the required bandwidth is:

$$\frac{(32 \text{ voices})(60 \text{ ns/2 voices})}{1/44,000} = 4.2\%$$

(Note: 2 voices=32 bits.) A bandwidth usage of 4.2% is very acceptable. If the PCI bus is not in burst mode, it typically operates four times slower, and the bandwidth usage is 17%. A bandwidth usage of 17% is also acceptable.

The present invention, therefore, is well adapted to carry out the objects and attain the ends and advantages mentioned herein as well as other ends and advantages made apparent from the disclosure. While preferred embodiments of the invention have been described for the purpose of disclosure, numerous changes and modifications to those embodiments described herein will be readily apparent to those skilled in the art and are encompassed within the spirit of the invention and the scope of the following claims.

What is claimed is:

1. A digital wavetable audio synthesizer system for providing audio enhancement to a host personal computer of the type including a central processor, a system memory which stores wavetable data, and a system bus, said system comprising:

an internal address-data bus;

a system bus interface for providing an interface to said system bus and for directing requests for wavetable data from said system memory;

a digital signal processor for generating digital audio signals, wherein, for each active voice, said digital signal processor processes a plurality of wavetable data samples, from a cache memory, before processing wavetable data samples for another active voice;

said cache memory for storing wavetable data requested from said system memory, and for accumulating audio signals generated by said digital signal processor; and output control circuitry for controlling the output of digital audio signals accumulated in said cache memory.

2. The digital wavetable audio synthesizer system of claim 1, further including an internal bus arbiter.

3. The digital wavetable audio synthesizer system of claim 1, further including clocking circuitry.

4. The digital wavetable audio synthesizer system of claim 1, further including a digital signal processor memory for storing instructions for said digital signal processor.

5. A digital wavetable audio synthesizer system for providing audio enhancement to a host personal computer of the type including a central processor, a system memory which stores wavetable data, and a system bus, said system comprising:

an internal address-data bus;

system bus interface means for providing an interface to said system bus and for directing requests for wavetable data from said system memory;

digital signal processor means for generating digital audio signals, wherein, for each active voice, said digital signal processor means processes a plurality of wavetable data samples, from a cache memory, before processing wavetable data samples for another active voice;

said cache memory, for storing wavetable data requested from said system memory, and for accumulating audio signals generated by said digital signal processor means; and output control circuitry means for controlling the output of digital audio signals accumulated in said cache memory.

6. The digital wavetable audio synthesizer system of claim 5, further including internal bus arbiter means for prioritizing requests to said internal address-data bus.

7. The digital wavetable audio synthesizer system of claim 5, further including means for clocking operations of said system.

8. The digital wavetable audio synthesizer system of claim 5, further including a digital signal processor memory for storing instructions for said digital signal processor means.

9. A monolithic integrated circuit for providing audio enhancement to a host personal computer of the type including a central processor, a system memory which stores wavetable data, and a system bus, said monolithic integrated circuit comprising:

an internal address-data bus;

a system bus interface for providing an interface to said system bus and for directing requests for wavetable data from said system memory;

a digital signal processor for generating digital audio signals, wherein, for each active voice, said digital signal processor processes a plurality of wavetable data samples, from a cache memory, before processing wavetable data samples for another active voice;

said cache memory, for storing wavetable data requested from said system memory, and for accumulating audio signals generated by said digital signal processor; and output control circuitry for controlling the output of digital audio signals accumulated in said cache memory.

10. The monolithic integrated circuit of claim 9, further including an internal bus arbiter.

11. The monolithic integrated circuit of claim 9, further including clocking circuitry.

12. The monolithic integrated circuit of claim 9, further including a digital signal processor memory for storing instructions for said digital signal processor.

13. A monolithic integrated circuit for providing audio enhancement to a host personal computer of the type including a central processor, a system memory which stores wavetable data, and a system bus, said monolithic integrated circuit comprising:

an internal address-data bus;

a system bus interface for providing an interface to said system bus and for directing requests for wavetable data from said system memory to be stored in cache memory external to said monolithic integrated circuit;

a digital signal processor for generating digital audio signals, wherein, for each active voice, said digital signal processor processes a plurality of wavetable data samples, from said external cache memory, before processing wavetable data samples for another active voice, and wherein said generated digital audio signals are accumulated in said external cache memory; and output control circuitry for controlling the output of digital audio signals accumulated in said external cache memory.

14. The monolithic integrated circuit of claim 13, further including an internal bus arbiter.

15. The monolithic integrated circuit of claim 13, further including clocking circuitry.

16. The monolithic integrated circuit of claim 13, further including a digital signal processor memory for storing instructions for said digital signal processor.

17. A method of processing wavetable data with a digital wavetable audio synthesizer system which provides audio enhancement to a host personal computer of the type including a central processor, system memory, and a system bus, wherein said wavetable data is stored in system memory, and wherein said system includes a digital signal processor for generating digital audio signals, and a cache memory, comprising the steps of:

(a) processing a plurality of wavetable data samples for an active voice, designated from a plurality of active voices, using said digital signal processor, and thereby generating digital audio signals, wherein said wavetable data samples are supplied from a first section of said cache memory;

(b) accumulating said generated digital audio signals in a second section of said cache memory;

(c) designating another active voice;

(d) periodically requesting and receiving from system memory wavetable data samples for each of said plurality of active voices, and storing said data samples received in said first section of said cache memory, so as to ensure a continuous supply of wavetable data for processing by said digital signal processor; and (e) repeating steps (a)–(d) as many times as desired.

18. The method of claim 17, wherein wavetable data for each active voice is arranged in system memory as a block of wavetable data samples.

19. The method of claim 18, wherein said requested wavetable data samples are transmitted in burst mode from said system memory to said digital wavetable audio synthesizer.

20. The method of claim 17, wherein said first section of said cache memory includes a first queue and a second queue, and wherein said first queue directly supplies wavetable data samples to said digital signal processor, and said second queue directly receives wavetable data samples from said system memory.

21. The method of claim 20, further including the step of toggling said first and second queues each time said digital signal processor completes processing of said wavetable data samples in said first queue.

22. The method of claim 17, wherein said second section of said cache memory includes a first queue and a second queue, and wherein said first queue is for accumulating a designated number of said generated digital audio signals as they are generated, and said second queue stores accumulated digital audio signals available to be output.

23. The method of claim 22, further including the step of toggling said first and second queues each time accumulation of said designated number of generated digital audio signals is complete.

24. The method of claim 22, further comprising the step of outputting said accumulated digital audio signals in said second queue.

25. The method of claim 17, wherein in step (d), wavetable data for more than one active voice can be requested at a time.

26. The method of claim 17, wherein, for each designated voice, digital audio signals having a higher pitch can be generated by said digital signal processor by requesting and retrieving from system memory in step (d) a sequence of wavetable data samples which excludes data samples at periodic intervals.

27. A method of processing wavetable data with a digital wavetable audio synthesizer system which provides audio enhancement to a host personal computer of the type including a central processor, system memory, and a system bus, wherein said wavetable data is stored in system memory, and wherein said system includes a digital signal processor for generating digital audio signals, and a first and second cache memory, comprising the steps of:

(a) processing a plurality of wavetable data samples for an active voice, designated from a plurality of active voices, using said digital signal processor, and thereby generating digital audio signals, wherein said wavetable data samples are supplied from said first cache memory;

(b) accumulating said generated digital audio signals in said second cache memory;

(c) designating another active voice;

(d) periodically requesting and receiving from system memory wavetable data samples for each of said plurality of active voices, and storing said data samples received in said first cache memory, so as to ensure a continuous supply of wavetable data for processing by said digital signal processor; and (e) repeating steps (a)–(d) as many times as desired.

28. The method of claim 27, wherein wavetable data for each active voice is arranged in system memory as a block of wavetable data samples.

29. The method of claim 28, wherein said requested wavetable data samples are transmitted in burst mode from said system memory to said digital wavetable audio synthesizer.

30. The method of claim 27, wherein said first cache memory includes a first queue and a second queue, and wherein said first queue directly supplies wavetable data samples to said digital signal processor, and said second queue directly receives wavetable data samples from said system memory.

31. The method of claim 30, further including the step of toggling said first and second queues each time said digital signal processor completes processing of said wavetable data samples in said first queue.

32. The method of claim 27, wherein said second cache memory includes a first queue and a second queue, and wherein said first queue is for accumulating a designated number of said generated digital audio signals as they are generated, and said second queue stores accumulated digital audio signals available to be output.

33. The method of claim 32, further including the step of toggling said first and second queues each time accumulation of said designated number of generated digital audio signals is complete.

34. The method of claim 32, further comprising the step of outputting said accumulated digital audio signals in said second queue.

35. The method of claim 27, wherein in step (d), wavetable data for more than one active voice can be requested at a time.

36. The method of claim 27, wherein, for each designated voice, digital audio signals having a higher pitch can be generated by said digital signal processor by requesting and retrieving from system memory in step (d) a sequence of wavetable data samples which excludes data samples at periodic intervals.

* * * * *